(12) United States Patent
Kim et al.

(10) Patent No.: US 8,629,450 B2
(45) Date of Patent: Jan. 14, 2014

(54) FLEXIBLE SUBSTRATE AND DISPLAY DEVICE INCLUDING THE FLEXIBLE SUBSTRATE

(75) Inventors: Jong-Yun Kim, Yongin (KR); Il-Jeong Lee, Yongin (KR); Young-Dae Kim, Yongin (KR); Jong-Mo Yeo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/183,612

(22) Filed: Jul. 15, 2011

(65) Prior Publication Data
US 2012/0168765 A1    Jul. 5, 2012

(30) Foreign Application Priority Data
Dec. 30, 2010    (KR) .................. 10-2010-0139432

(51) Int. Cl.
*H01L 29/786*    (2006.01)
(52) U.S. Cl.
USPC ........ 257/72; 257/E29.273; 257/88; 257/414; 257/443; 257/79; 428/688; 428/213

(58) Field of Classification Search
USPC ............... 257/72, E29.273, 88, 414, 443, 79; 428/688, 213; 252/500, 511, 512, 519
See application file for complete search history.

(56) References Cited

U.S. PATENT DOCUMENTS

| 5,688,841 A | 11/1997 | Parish |
| 2006/0078682 A1* | 4/2006 | McDaniel et al. ......... 427/372.2 |
| 2009/0085182 A1* | 4/2009 | Yamazaki et al. ............ 257/679 |
| 2010/0167435 A1* | 7/2010 | Bae et al. ........................ 438/23 |

FOREIGN PATENT DOCUMENTS

| JP | 2005011776 | 1/2005 |
| JP | 2008021575 | 1/2008 |
| KR | 10-2002-0004352 | 1/2002 |
| KR | 10-0372883 | 2/2003 |
| KR | 1020060107973 | 10/2006 |
| KR | 10-2007-0082645 | 8/2007 |
| KR | 10-2008-0101488 | 11/2008 |
| KR | 10-2009-0035619 | 4/2009 |

* cited by examiner

*Primary Examiner* — Cathy N Lam
(74) *Attorney, Agent, or Firm* — Robert E. Bushnell, Esq.

(57) ABSTRACT

A flexible substrate for a display device comprises a polymer resin, an inorganic fiber material, and an antistatic agent, and has a surface resistivity of less than $10^{11} \Omega$. A display device includes the flexible substrate.

23 Claims, 4 Drawing Sheets

FLEXIBLE SUBSTRATE AND DISPLAY DEVICE INCLUDING THE FLEXIBLE SUBSTRATE

CLAIM OF PRIORITY

This application makes reference to, incorporates the same herein, and claims all benefits accruing under 35 U.S.C. §119 from an application for FLEXIBLE SUBSTRATE AND DISPLAY DEVICE INCLUDING THE SAME earlier filed in the Korean Intellectual Priority Office on 30 Dec. 2010 and there duly assigned Serial No. 10-2010-0139432.

BACKGROUND OF THE INVENTION

1. Field of the Invention

The present invention relates to a flexible substrate and a display device including the flexible substrate.

2. Description of the Related Art

A display device, such as an organic light emitting device and a liquid crystal display (LCD), includes a substrate having a device therein.

The substrate for a display device may, in general, include a glass substrate, a polymer substrate, or the like.

However, since a glass substrate is heavy and fragile, it may not only have a limit in that it may be used in a portable and big screen, but it may also be damaged by an external impact. Accordingly, it may hardly be applied to a flexible display device.

Since a polymer substrate is made of a flexible material, it may have more advantages than the glass substrate in terms of portability, safety, lightness, and the like. In addition, since the polymer substrate is fabricated in a deposit or printing method with a lower cost and also, when it is applied to a display device in a roll-to-roll process unlike a conventional sheet unit process, the display device is massively produced with a low cost. However, the polymer substrate may be easily degraded due to moisture permeation and oxygen transmission of the polymer material itself. The polymer substrate has weak heat resistance, and thus it may be transformed at a high temperature, having an influence on characteristics of a device. In particular, the substrate is contracted or expanded due to temperature change during the process, and thus it is easily transformed in shape.

SUMMARY OF THE INVENTION

The present invention provides a flexible substrate for a display device which is prepared in a simple process with no transformation.

The present invention also provides a display device including the flexible substrate.

According to one embodiment, a flexible substrate for a display device includes a polymer resin, an inorganic fiber material, and an antistatic agent, and has a surface resistivity of less than about $10^{11}\Omega$.

The inorganic fiber material may have a length longer than the thickness of the substrate.

The inorganic fiber material may have a length ranging from about 50 to 500 μm.

The inorganic fiber material may include a glass fiber and a conductive layer coated on the surface of the glass fiber.

The inorganic fiber material may be included in an amount ranging from about 20 to 40 wt % based on the total amount of the polymer resin, the inorganic fiber material, and the antistatic agent.

The antistatic agent may include a conductive polymer, carbon black, metal powder, metal salt, or a combination thereof.

The antistatic agent may be included in an amount ranging from about 2 to 10 wt % based on the total amount of the polymer resin, the inorganic fiber material, and the antistatic agent.

The flexible substrate may include a first layer including the polymer resin, the inorganic fiber material and the antistatic agent, and a second layer positioned on at least either of the lower and upper sides of the first layer, and including an antistatic agent dispersed in a polymer resin.

The second layer may be thinner than the first layer.

The polymer resin may include polyimide.

According to another embodiment, a display device is provided and comprises a flexible substrate including a polymer resin, an inorganic fiber material, and an antistatic agent, and having a surface resistivity of less than about $10^{11}\Omega$, a thin film transistor disposed on the flexible substrate, and a pixel electrode connected to the thin film transistor.

The inorganic fiber material may have a length longer than the thickness of the substrate.

The inorganic fiber material may have a length ranging from about 50 to 500 μm.

The inorganic fiber material may include a glass fiber and a conductive layer coated on the surface of the glass fiber.

The inorganic fiber material may be included in an amount ranging from about 20 to 40 wt % based on the total amount of the polymer resin, the inorganic fiber material, and the antistatic agent.

The antistatic agent may include a conductive polymer, carbon black, metal powder, metal salt, or a combination thereof.

The antistatic agent may be included in an amount ranging from about 2 to 10 wt % based on the total amount of the polymer resin, the inorganic fiber material, and the antistatic agent.

The flexible substrate may comprise a first layer including the polymer resin, the inorganic fiber material and the antistatic agent, and a second layer disposed on at least either of the lower and upper sides of the first layer, and including an antistatic agent dispersed in a polymer resin.

The polymer resin may include polyimide.

The display device may further include a common electrode facing the pixel electrode and an organic emission layer positioned between the pixel electrode and the common electrode.

Therefore, the polymer substrate may have less contraction or expansion due to heat during the process with no additional process, thus improving anti-static effects.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar compnents, wherein.

DETAILED DESCRIPTION OF THE INVENTION

Figure 1:
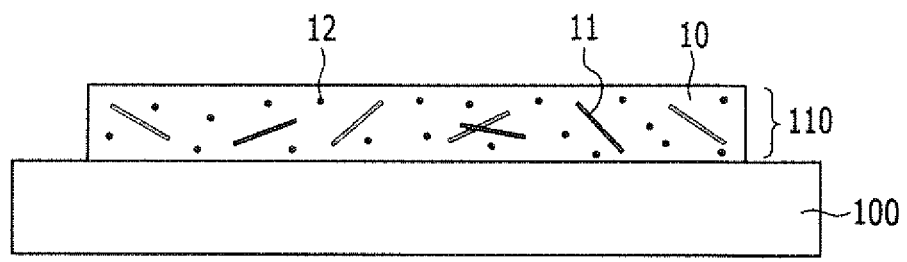
FIG. 1 is a cross-sectional view schematically showing a flexible substrate for a display device according to an embodiment of the invention.

The present disclosure will be described more fully hereinafter with reference to the accompanying drawings, in which exemplary embodiments of this disclosure are shown. This disclosure may, however, be embodied in many different forms and should not be construed as limited to the exemplary embodiments set forth herein.

In the drawings, the thickness of layers, films, panels, regions, etc. are exaggerated for clarity. Like reference numerals designate like elements throughout the specification. It will be understood that, when an element such as a layer, film, region or substrate is referred to as being "on" another element, it can be directly on the other element or intervening elements may also be present. In contrast, when an element is referred to as being "directly on" another element, there are no intervening elements present.

Hereinafter, referring to FIGS. 1 and 2, a substrate for a display device is described in accordance with an embodiment.

Figure 2:
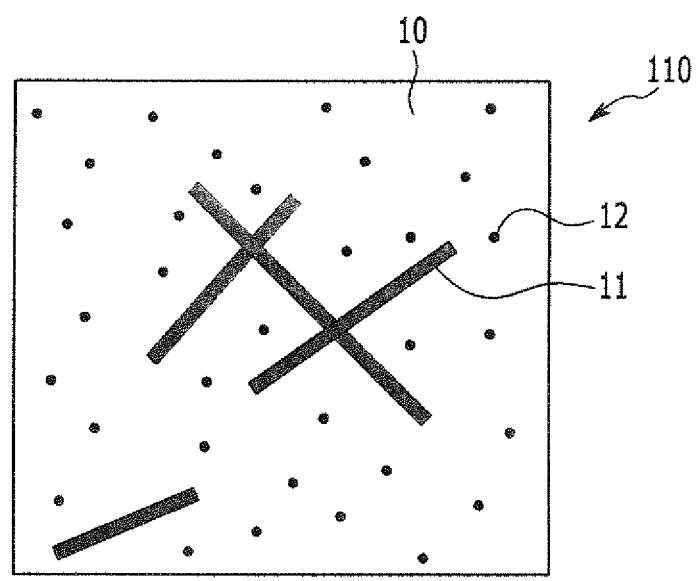
FIG. 2 is a top plan view schematically showing the flexible substrate for the display device of FIG. 1.

FIG. 1 is a cross-sectional view schematically showing a substrate for a display device according to an embodiment of the invention, and FIG. 2 is a top plan view schematically showing the substrate for the display device of FIG. 1.

According to one embodiment, a substrate 110 for a display device may include a polymer resin 10, an inorganic fiber material 11, and an antistatic agent 12.

The polymer resin 10 is a supporter made of a polymer material and may be made of a thermosetting resin. The thermosetting resin may include, for example, polyimide.

The inorganic fiber material 11 is randomly dispersed in the polymer resin 10.

The inorganic fiber material 11 may have a rod shape extending in one direction and, for example, may be a pipe or a plate which is hollow or filled with something. The inorganic fiber material 11 may have a length longer than the thickness of the substrate 110, and may have a length ranging from about 50 to 500 μm.

The inorganic fiber material 11 may include, for example, glass fiber and the like.

The inorganic fiber material 11 may be randomly dispersed in the polymer resin 10, and thus it may prevent transformation of the substrate 110 and, particularly, planar contraction due to heat. Accordingly, the substrate may not be bent due to heat. In addition, the inorganic fiber material 11 may absorb external mechanical strength or transfer it to another layer. Accordingly, it may not be easily broken by an external impact.

The inorganic fiber material 11 may be included in an amount ranging from about 20 to 40 wt % based on the total amount of the polymer resin, the inorganic fiber material and the antistatic agent. When the inorganic fiber material 11 is included within that range, it may prevent a substrate from contracting due to heat, but also keep it flexible as well as increase its mechanical strength.

The antistatic agent 12 may be made of a conductive material, for example, conductive polymer, carbon black, metal powder, metal salt, or a combination thereof.

The antistatic agent 12 may be particles like powder, and may be uniformly dispersed in the polymer resin 10.

The substrate 110 made of a polymer resin is attached to a supporter 100 like glass, and it detached from the supporter 100 after the process. Herein, the detachment may be performed by using, for example, a laser to bring about a static electricity defect.

The antistatic agent 12 may remove static electricity generated during the detachment from the supporter 100, and thus may prevent the static electricity from flowing into a device on the substrate 110. Accordingly, the substrate 110 may need no separate anti-static layer, and may have no static electricity defect.

The antistatic agent 12 may be included in an amount ranging from about 2 to 10 wt % based on the total amount of the polymer resin, the inorganic fiber material, and the antistatic agent. When the antistatic agent 12 is included within that range, the substrate 110 may maintain a surface resistivity of less than about $10^{11}\Omega$. When the substrate 110 maintains a surface resistivity within that range, it may prevent transformation of a device thereon due to static electricity. The smaller the surface resistivity that the substrate 110 has, the better it is. However, it may maintain a surface resistivity ranging from about $10^3$ to $10^{11}\Omega$.

Hereinafter, a substrate for a display device according to another embodiment is illustrated with reference to FIG. 3, as well as FIG. 1.

Figure 3:
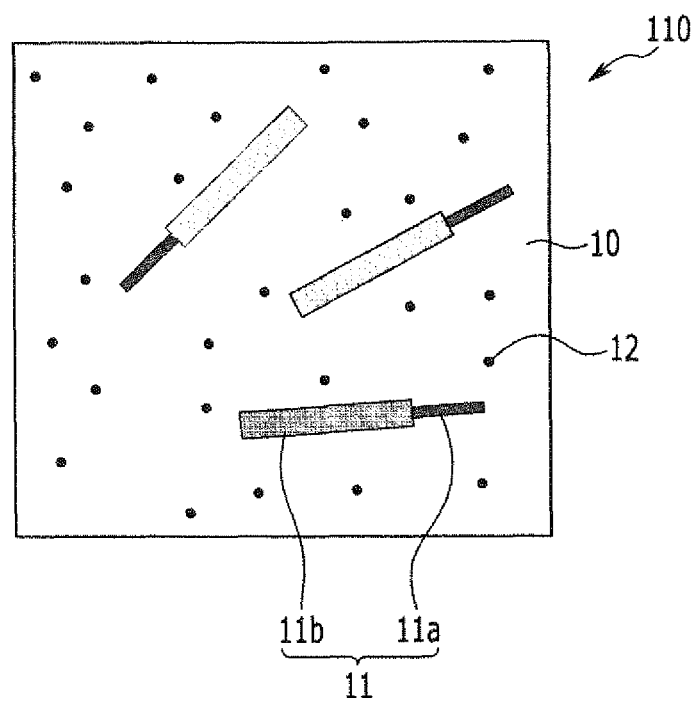
FIG. 3 is a top plan view schematically showing the flexible substrate for a display device according to another embodiment of the invention.

FIG. 3 is a top plan view schematically showing the substrate for a display device according to another embodiment of the invention.

According to this embodiment, a substrate 110 for a display device may include a polymer resin 10, an inorganic fiber material 11, and an antistatic agent 12 as illustrated in the aforementioned embodiment.

The inorganic fiber material 11 may include inorganic fiber 11a in the core and a conductive layer 11b on the surface of the inorganic fiber 11a.

The inorganic fiber 11a may be, for example, glass fiber. The conductive layer 11b may include, for example, conductive polymer, carbon black, metal powder, metal salt, or a combination thereof.

The conductive layer 11b may further increase anti-static effects with the antistatic agent 12.

Hereinafter, a substrate for a display device according to still another embodiment is illustrated with reference to FIGS. 4 thru 6.

Figure 4:
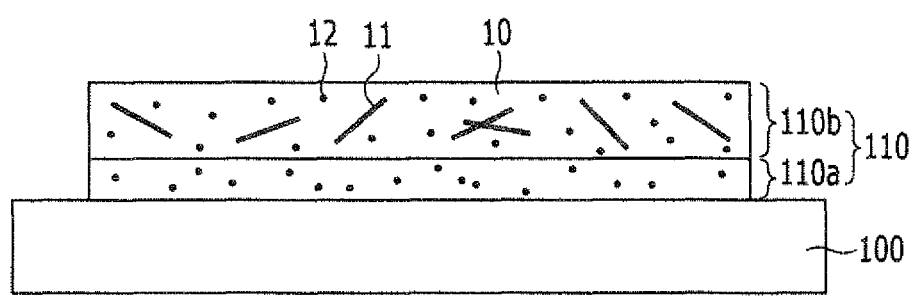
FIGS. 4 thru 6 are cross-sectional views showing a flexible substrate for a display device according to another embodiment of the invention.
Figure 5:
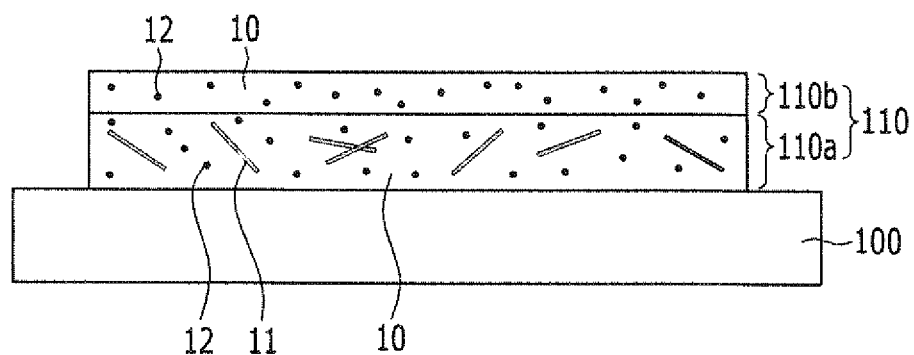
Figure 6:
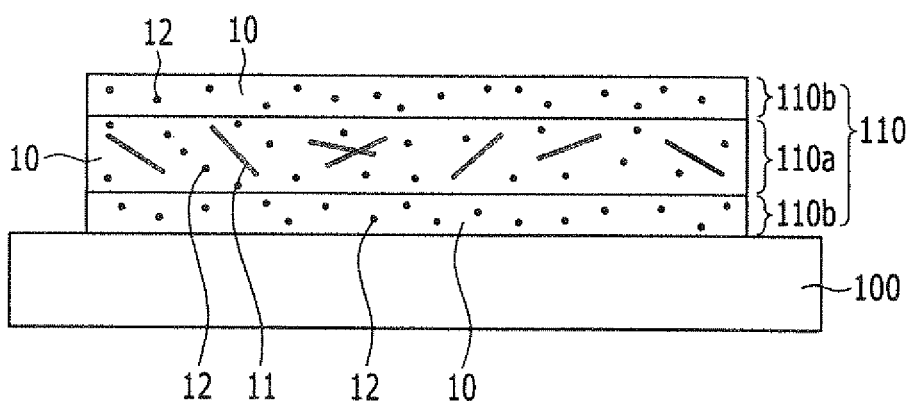

FIGS. 4 thru 6 are a cross-sectional view showing the substrate for a display device according to another embodiment of the invention.

Referring to FIG. 4, a substrate 110 for a display device may include a first polymer layer 110a and a second polymer layer 110b.

The first polymer layer 110a may include a polymer resin 10, an inorganic fiber material 11, and an antistatic agent 12, as in the aforementioned substrate 110.

The polymer resin 10 may be, for example, polyimide. The inorganic fiber material 11 may be, for example, glass fiber. The antistatic agent 12 may be, for example, conductive polymer, carbon black, metal powder, metal salt, or a combination thereof.

The second polymer layer 110b may include the polymer resin 10 and the antistatic agent 12.

The second polymer layer 110b may be thinner than the first polymer layer 110a. Since the second polymer layer 110b may not include an inorganic fiber material 11, it may be contracted or expanded due to heat when it is thick. Thus, it should be thin.

In addition, since the second polymer layer 110b is positioned under the first polymer layer 110a, it may contact a glass substrate used as a supporter during the process.

When as a separate layer, the second polymer layer 110b, including the antistatic agent 12, is disposed between the glass substrate 100 and the first polymer layer 110a, it may effectively remove static electricity generated during the detachment of the substrate 110 from the glass substrate 100, and effectively prevent a device defect due to the static electricity.

Referring to FIG. 5, the second polymer layer 110b may be disposed on the first polymer layer 110a. Herein, the second polymer layer 110b may efficiently prevent static electricity, which is generated when a substrate 110 is detached from a glass substrate 100, from moving from the first polymer layer 110a to a device.

Referring to FIG. 6, the second polymer layer 110b is positioned on the lower and upper sides of the first polymer layer 110a. When the second polymer layer 110b is disposed on both lower and upper sides of the first polymer layer 110a, it may effectively remove static electricity generated when a substrate 110 is detached from the glass substrate 100, and may efficiently prevent the static electricity from moving from the first polymer layer 110a to a device. Accordingly, it may further improve antistatic effects.

Hereinafter, a display device including the aforementioned substrate is illustrated with reference to FIG. 7, along with FIGS. 1 thru 6.

Figure 7:
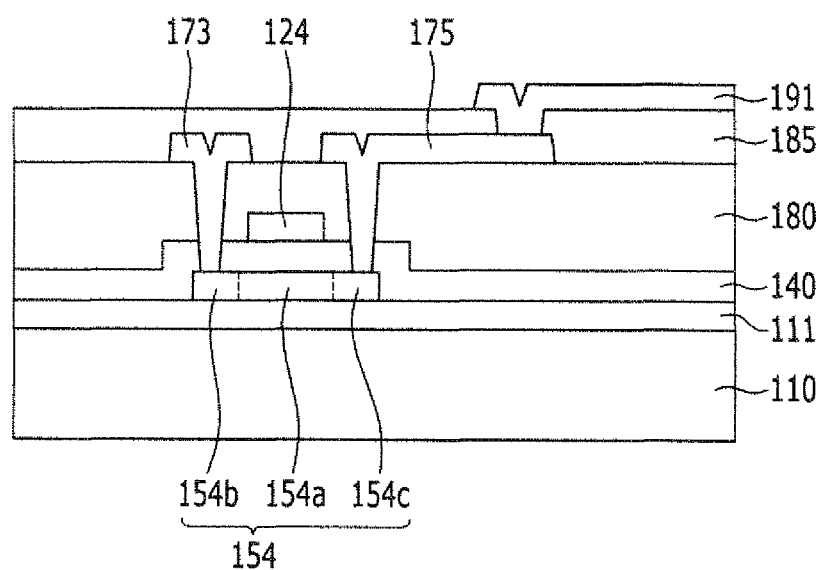
FIG. 7 is a cross-sectional view schematically showing a display device according to an embodiment of the invention.

FIG. 7 is a cross-sectional view schematically showing a display device according to an embodiment of the invention.

According to one embodiment, the display device may include a substrate 110, a thin film transistor on the substrate 110, and a pixel electrode 191 connected to the thin film transistor.

The substrate 110 may be a polymer substrate, including a polymer resin 10, an inorganic fiber material 11 and an antistatic agent 12 as aforementioned.

The polymer resin 10 may be a supporter made of a polymer material, and may be a thermosetting resin. The thermosetting resin may include, for example, polyimide.

The inorganic fiber material 11 is randomly dispersed in the polymer resin 10.

The inorganic fiber material 11 may have a rod shape extending in one direction, for example, a pipe or a plate which is hollow or filled with something. The inorganic fiber material 11 may have a length longer than the thickness of the substrate 110, and the length may range from about 50 to 500 μm.

The inorganic fiber material 11 may include, for example, glass fiber or the like.

The inorganic fiber material 11 may be included in an amount ranging from about 20 to 40 wt % based on the total amount of the polymer resin 10, the inorganic fiber material 11, and the antistatic agent 12.

When the inorganic fiber material 11 is included within that range, it may prevent contraction due to heat and increase mechanical strength, maintaining a flexible characteristic.

The antistatic agent 12 may include a conductive material and, for example, a conductive polymer, carbon black, a metal powder, a metal salt, or a combination thereof.

The antistatic agent 12 may be particles like powder, and thus may be uniformly dispersed in a polymer resin 10. The antistatic agent 12 may be included in an amount ranging from about 2 to 10 wt % based on the total amount of the polymer resin 10, the inorganic fiber material 11, and the antistatic agent 12.

A buffer layer 111 is disposed on the substrate 110. The buffer layer 111 may prevent impurities generated from the substrate 110 or moisture flowing in from the outside from being transferred to the upper layer, and may adjust heat delivery speed during the heat treatment described later, promoting a uniform crystalline of a semiconductor pattern.

The thin film transistor may include a semiconductor pattern 154 on the buffer layer 111, a gate electrode 124 overlapped with the semiconductor pattern 154, a gate insulating layer 140 between the semiconductor pattern 154 and the gate electrode 124, and a source electrode 173 and a drain electrode 175 electrically connected to the semiconductor pattern 154.

The semiconductor pattern 154 has a channel region 154a, a source region 154b, and a drain region 154c. The source region 154b and the drain region 154c may be doped with p-type or n-type impurities.

The gate electrode 124 is disposed on the gate insulating layer 140 and is overlapped with the channel region 154a of the semiconductor pattern 154.

On the gate electrode 124, a planarization layer 180 is disposed. The planarization layer 180 has contact holes respectively exposing the source region 154s and the drain region 154d of the semiconductor pattern 154.

The source electrode 173 and the drain electrode 175 are connected to the source region 154b and the drain region 154c, respectively, of the semiconductor pattern 154 through the contact holes.

The pixel electrode 191 is disposed on the source electrode 173 and the drain electrode 175, and the insulation layer 185 is disposed between the pixel electrode 191 on one side and the source electrode 173 and the drain electrode 175 on another side. The pixel electrode is connected to the drain electrode 175 through a contact hole in the insulation layer 185.

A display device, including a substrate 110, a thin film transistor, and a pixel electrode 191 as aforementioned, may be used as a thin film transistor array panel for various electronic devices.

For example, this thin film transistor array panel may form a liquid crystal display (LCD) with another display panel facing this panel and a liquid crystal layer disposed between two display panels.

For example, the thin film transistor array panel may form an organic light emitting device with a common electrode facing the pixel electrode 191 and an emission layer disposed between the pixel electrode 191 and the common electrode.

Since this display device includes the aforementioned substrate 110, the substrate may prevent the device from transformation due to contraction and/or expansion as a result of heat, and thus improve its antistatic effects.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible substrate for a display device, comprising:
a polymer resin provided as a supporter;
an inorganic fiber material randomly dispersed in the polymer resin; and
an antistatic agent comprising particles dispersed in the polymer resin;

the inorganic fiber material comprising a plurality of rod-shaped elements, each having a length longer than a thickness of the flexible substrate.

2. The flexible substrate of claim 1, comprised of the rod-shaped elements of the inorganic fiber material each having a length ranging from about 50 to 500 μm.

3. The flexible substrate of claim 1, comprised of the inorganic fiber material comprising glass fiber elements and a conductive layer coated on the surface of the glass fiber elements.

4. The flexible substrate of claim 1, comprised of the inorganic fiber material being included in an amount ranging from about 20 to 40 wt % based on a total weight of the polymer resin, the inorganic fiber material, and the antistatic agent.

5. The flexible substrate of claim 1, comprised of the antistatic agent comprising one of a conductive polymer, carbon black, a metal powder, a metal salt, and a combination thereof.

6. The flexible substrate of claim 1, comprised of the antistatic agent being included in an amount ranging from about 2 to 10 wt % based on a total weight of the polymer resin, the inorganic fiber material, and the antistatic agent.

7. A flexible substrate for a display device, comprising:
a polymer resin provided as a supporter;
an inorganic fiber material randomly dispersed in the polymer resin; and
an antistatic agent comprising particles dispersed in the polymer resin;
the flexible substrate further comprising a first layer including the polymer resin, the inorganic fiber material and the antistatic agent, and a second layer disposed on at least one of a lower side and an upper side of the first layer and comprising an antistatic agent dispersed in a polymer resin.

8. The flexible substrate of claim 7, comprised of the second layer being thinner than the first layer.

9. The flexible substrate of claim 1, comprised of the polymer resin comprising polyimide.

10. A display device, comprising:
a flexible substrate including a polymer resin provided as a supporter, an inorganic fiber material randomly dispersed in the polymer resin, and an antistatic agent comprising particles dispersed in the polymer resin;
a thin film transistor disposed on the flexible substrate; and
a pixel electrode connected to the thin film transistor.

11. The display device of claim 10, comprised of the inorganic fiber material comprising a plurality of rod-shaped elements, each having a length longer than a thickness of the flexible substrate.

12. The display device of claim 11, comprised of the particles of the inorganic fiber material each having a length ranging from about 50 to 500 μm.

13. The display device of claim 10, comprised of the inorganic fiber material comprising glass fiber elements and a conductive layer coated on the surface of the glass fiber elements.

14. The display device of claim 10, comprised of the inorganic fiber material being included in an amount ranging from about 20 to 40 wt % based on a total weight of the polymer resin, the inorganic fiber material, and the antistatic agent.

15. The display device of claim 10, comprised of the antistatic agent comprising one of a conductive polymer, carbon black, metal powder, metal salt, and a combination thereof.

16. The display device of claim 10, comprised of the antistatic agent being included in an amount ranging from about 2 to 10 wt % based on a total weight of the polymer resin, the inorganic fiber material, and the antistatic agent.

17. The display device of claim 10, comprised of the flexible substrate comprising a first layer including the polymer resin, the inorganic fiber material and the antistatic agent, and a second layer disposed on at least one of a lower side and an upper side of the first layer and comprising an antistatic agent dispersed in a polymer resin.

18. The display device of claim 10, comprised of the polymer resin comprising polyimide.

19. The display device of claim 10, further comprising a common electrode facing the pixel electrode, and an organic emission layer disposed between the pixel electrode and the common electrode.

20. A flexible substrate for a display device, comprising:
a polymer resin provided as a supporter;
an inorganic fiber material randomly dispersed in the polymer resin; and
an antistatic agent comprising particles dispersed in the polymer resin;
the flexible substrate further comprising a first layer including the polymer resin, the inorganic fiber material and the antistatic agent, a second layer disposed on a lower side of the first layer and including an antistatic agent dispersed in a polymer resin, and a third layer disposed on an upper side of the first layer and including an antistatic agent dispersed in a polymer resin.

21. The display device of claim 10, comprised of the flexible substrate comprising a first layer including the polymer resin, the inorganic fiber material and the antistatic agent, a second layer disposed on a lower side of the first layer and including an antistatic agent dispersed in a polymer resin, and a third layer disposed on an upper side of the first layer and including an antistatic agent dispersed in a polymer resin.

22. The flexible substrate of claim 1, comprised of the flexible substrate having a surface resistivity of less than $10^{11} \Omega$.

23. The display device of claim 10, comprised of the flexible substrate having a surface resistivity of less than $10^{11} \Omega$.

* * * * *